(12) United States Patent
Shim et al.

(10) Patent No.: US 11,094,768 B2
(45) Date of Patent: Aug. 17, 2021

(54) ELECTROLUMINESCENCE DISPLAY CAPABLE OF IMPROVING AN APERTURE RATIO

(71) Applicant: LG Display Co., Ltd., Seoul (KR)

(72) Inventors: Jongsik Shim, Paju-si (KR); Byeonguk Gang, Paju-si (KR); Seonghwan Hwang, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/413,268

(22) Filed: May 15, 2019

(65) Prior Publication Data
US 2019/0355802 A1  Nov. 21, 2019

(30) Foreign Application Priority Data

May 16, 2018 (KR) .................. 10-2018-0055891

(51) Int. Cl.
*H01L 27/32* (2006.01)
*G09G 3/3225* (2016.01)

(52) U.S. Cl.
CPC ....... *H01L 27/3276* (2013.01); *G09G 3/3225* (2013.01); *H01L 27/3262* (2013.01); *G09G 2300/0426* (2013.01)

(58) Field of Classification Search
CPC ............ H01L 27/3297; H01L 27/3262; G09G 3/3225; G09G 2300/0426
See application file for complete search history.

(56) References Cited

U.S. PATENT DOCUMENTS

2007/0176859 A1*  8/2007  Cok ................. H01L 27/3276 345/76

FOREIGN PATENT DOCUMENTS

| KR | 10-2013-0092364 A | 8/2013 |
| KR | 10-2016-0057587 A | 5/2016 |
| KR | 10-2018-0014381 A | 2/2018 |

* cited by examiner

*Primary Examiner* — Wing H Chow
(74) *Attorney, Agent, or Firm* — Seed IP Law Group LLP

(57) ABSTRACT

An electroluminescence display includes a plurality of sub-pixels, each of the plurality of sub-pixels including a light emission region, and a first circuit region and a second circuit region disposed on respective sides of the light emission region. Power supply lines are configured to supply a first power to at least one of the second circuit regions of the sub-pixels arranged at odd-numbered row and the first circuit regions of the sub-pixels arranged at an even-numbered row. A sensing line is configured to supply an initialization voltage or a sensing voltage to at least one of the first circuit regions of the sub-pixels arranged at the odd-numbered row and the second circuit regions of the sub-pixels arranged in the even-numbered row.

18 Claims, 11 Drawing Sheets

ELECTROLUMINESCENCE DISPLAY CAPABLE OF IMPROVING AN APERTURE RATIO

CROSS-REFERENCE TO RELATED APPLICATION

This disclosure claims the benefit of Republic of Korea Patent Application No. 10-2018-0055891 filed on May 16, 2018, the entire contents of which is incorporated herein by reference in its entirety.

BACKGROUND

Technical Field

This disclosure relates to an electroluminescence display, and more particularly to an electroluminescence display capable of improving an aperture ratio.

Description of the Related Art

In recent, various flat panel display (FPDs) capable of reducing weight and volume, which are disadvantages of CRT (Cathode Ray Tube) display, have been developed. As such FPDs, various FPDs such as a liquid crystal display (LCD), a field emission display (FED), a plasma display panel (PDP), and an electroluminescence display (ELD) have been developed and utilized.

Among these FPDs, the electroluminescence display is a self-luminous display that excites an organic compound to emit light. The electroluminescence display is advantageous in that a backlight used in an LCD is not required, so that it is lightweight and thin and can simplify a process. Further, the organic light emitting display is widely used because it can be manufactured at low temperature, has a high response speed of 1 ms or less as well as low power consumption, wide viewing angle, and high contrast.

The electroluminescence display includes a storage capacitor to maintain a constant current during light emission. Since the storage capacitor is provided for each pixel and occupies a certain area, an aperture ratio of the electroluminescence display is reduced. The aperture ratio has become an important issue in recent years due to the high resolution trend of display devices. It is necessary to realize an electroluminescence display having a high aperture ratio, because the current density of the light emitting element can be lowered to increase the lifetime of the light emitting element and an adaptability to a high-resolution display is increased by increasing the aperture ratio.

BRIEF SUMMARY

The disclosure is directed to an electroluminescence display having a high aperture ratio suitable for a high-resolution electroluminescence display.

According to an aspect of the present disclosure, an electroluminescence display includes a plurality of sub-pixels, each of the plurality of sub-pixels including a light emission region, and a first circuit region and a second circuit region disposed on respective sides of the light emission region; power supply lines configured to supply a first power to at least one of the second circuit regions of the sub-pixels arranged at an odd-numbered row and the first circuit regions of the sub-pixels arranged at an even-numbered row; and a sensing line configured to supply an initialization voltage or a sensing voltage to at least one of the first circuit regions of the sub-pixels arranged at the odd-numbered row and the second circuit regions of the sub-pixels arranged in the even row.

The plurality of sub-pixels includes a first, a second, a third and a fourth sub-pixels. The power supply lines include a first power supply line disposed at a left side of the first sub-pixel, and supplying a first power to the second circuit regions of the first and second sub-pixels disposed at the odd-numbered row, and supplying the first power to the first circuit regions of the first and second sub-pixels disposed at the even-numbered rows; and a second power supply line disposed at a right side of the fourth sub-pixel, and supplying the first power to the second circuit regions of the third and fourth sub-pixels disposed at the odd-numbered row, and supplying the first power to the first circuit regions of the third and fourth sub-pixels disposed at the even-numbered row.

The first power supply line includes a first horizontal power supply branch line connected to the first power supply line and extended along a row direction; and a first vertical power supply branch line extended from the first horizontal power supply branch line along a column direction. The second power supply line includes a second horizontal power supply branch line connected to the second power supply line and extended along the row direction; and a second vertical power supply branch line extended from the second horizontal power supply branch line along the column direction.

The sensing line includes a first horizontal sensing branch line connected to the sensing line and extended toward the first power supply line along the row direction; a first vertical sensing branch line extended from the first horizontal sensing branch line along the column direction; a second horizontal sensing branch line connected to the sensing line and extended toward the second power supply line along the row direction; and a second vertical sensing branch line extended from the second horizontal sensing branch line along the column direction.

Each of the first circuit regions of the sub-pixels disposed at the odd-numbered row includes a sensing thin film transistor, wherein each of the second circuit regions of the sub-pixels disposed at the odd-numbered row includes a driving thin film transistor. Each of the second circuit regions of the sub-pixels disposed at the even-numbered row includes a sensing thin film transistor, wherein each of the first circuit regions of the sub-pixels disposed at the even-numbered rows includes a driving thin film transistor.

The first vertical power supply branch line is connected to the driving thin film transistors of the first and second sub-pixels disposed on at least one side of upper and lower sides of the first horizontal power supply branch line. The second vertical power supply branch line is connected to the driving thin film transistors of the third and fourth sub-pixels disposed on at least one side of upper and lower sides of the second horizontal power supply branch line.

The first vertical sensing branch line is connected to the sensing thin film transistors of the first and second sub-pixels disposed on at least one side of upper and lower sides of the first horizontal sensing branch line. The second vertical sensing branch line is connected to the sensing thin film transistors of the third and fourth sub-pixels disposed on at least one side of upper and lower sides of the second horizontal sensing branch line.

The electroluminescence display further includes a first and second data lines disposed between the first sub-pixel and the second sub-pixel, and extended in parallel with each other along the column direction; and a third and fourth data lines disposed between the third sub-pixel and the fourth sub-pixel, and extended in parallel with each other along the column direction. The first circuit region of each the first to fourth sub-pixels disposed at the odd-numbered row and the second circuit region of each the first to fourth sub-pixels disposed at the even-numbered row include the switching thin film transistor, respectively. The first data line is connected to the switching thin film transistor of the first sub-pixel, the second data line is connected to the switching thin film transistor of the second sub-pixel, the third data line is connected to the switching thin film transistor of the third sub-pixel, and the fourth data line is connected to the switching thin film transistor of the fourth sub-pixel.

The electroluminescence display further includes a first scan line and a second scan line disposed at one side of the sub-pixels disposed at one row and extended in parallel with each other along the row direction. The first scan line is connected to a gate electrode of the sensing thin film transistor, and the second scan line is connected to a gate electrode of the sensing thin film transistor.

The light emission region includes a transparent storage capacitor having a first electrode connected to a drain electrode of the sensing thin film transistor and a second electrode connected to a drain electrode of the switching thin film transistor.

The electroluminescence display further includes a storage capacitor having a first electrode and a second electrode facing each other with an insulating layer interposed therebetween in the light emission region.

According to an another aspect of the present disclosure, an electroluminescence display includes a substrate including a plurality of a light emission regions, and first circuit regions and second circuit regions disposed at respective sides of the light emission regions; power supply lines, a sensing line and data lines arranged along a row direction and extended along a column direction outside the light emission regions; a semiconductor layer disposed on a buffer layer covering the power supply lines, the sensing line and the data lines to expose a portion of them; scan lines, branch lines and thin film transistors disposed on a gate insulating layer covering the semiconductor layer to expose a portion of the semiconductor layer, and disposed in the first and second circuit regions; color filters disposed to correspond to the light emission regions on a passivation layer covering the scan lines, the branch lines and the thin film transistors; and organic light emitting diodes disposed on an overcoat layer covering the color filters, each of the organic light emitting diodes being connected to one of the transistors via a contact hole passing through the overcoat layer and the passivation layer.

The thin film transistors includes a sensing thin film transistor, a switching thin film transistor, and a driving thin film transistor disposed in the first and second circuit regions. A first and second light shielding patterns are disposed in each of first circuit regions related to light emission regions disposed at the odd-numbered row so that the first light shielding pattern corresponds to a sensing thin film transistor disposed in the first circuit region of the odd-numbered row, and the second light shielding pattern corresponds to a switching thin film transistor disposed in the first circuit region of the odd-numbered row, and a third light shielding pattern is disposed in each of second circuit regions related to the light emission regions disposed at the odd-numbered rows so that the third light shielding pattern corresponds to a driving thin film transistors disposed in the second circuit region of the odd-numbered row. A fourth light shielding pattern is disposed in each of first circuit regions related to light emission regions disposed at the even-numbered rows so that the fourth light shielding pattern corresponds to a driving thin film transistor disposed in the first circuit region of the even-numbered row, and a fifth and sixth light shielding patterns are disposed in each of second circuit regions related to light emission regions disposed in the even-numbered rows so that the third light shielding pattern corresponds to a sensing thin film transistors disposed in the second circuit region of the even-numbered row and the sixth light shielding pattern corresponds to a switching thin film transistors disposed in the second circuit region of the even-numbered row.

A first electrode of a storage capacitor is disposed in each of the light emission regions, the first electrode being disposed on the same layer as the power supply lines, the sensing line and the data lines.

Each of the power supply lines, the sensing line and the data lines includes a transparent conductive layer on the substrate and a metal layer disposed on the transparent conductive layer. The first electrode of the storage electrode includes the transparent conductive layer.

The power supply lines include a first power supply line and a second power supply line arranged in parallel with each other. The first power supply line includes a first horizontal power supply branch line connected to the first power supply line and extended along a row direction; and a first vertical power supply branch line extended from the first horizontal power supply branch line along a column direction. The second power supply line includes a second horizontal power supply branch line connected to the second power supply line and extended along the row direction; and a second vertical power supply branch line extended from the second horizontal power supply branch line along the column direction.

The power supply lines include a first power supply line and a second power supply line arranged in parallel with each other. The sensing line includes a first horizontal sensing branch line connected to the sensing line and extended toward the first power supply line along the row direction; a first vertical sensing branch line extended from the first horizontal sensing branch line along the column direction; a second horizontal sensing branch line connected to the sensing line and extended toward the second power supply line along the row direction; and a second vertical sensing branch line extended from the second horizontal sensing branch line along the column direction.

The first vertical power supply branch line is connected to the driving thin film transistors of the first and second sub-pixels disposed on at least one side of upper and lower sides of the first horizontal power supply branch line. The second vertical power supply branch line is connected to the driving thin film transistors of the third and fourth sub-pixels disposed on at least one side of upper and lower sides of the second horizontal power supply branch line.

The first vertical sensing branch line is connected to the sensing thin film transistors of the first and second sub-pixels disposed on at least one side of upper and lower sides of the first horizontal sensing branch line. The second vertical sensing branch line is connected to the sensing thin film transistors of the third and fourth sub-pixels disposed on at least one side of upper and lower sides of the second horizontal sensing branch line.

According to the electroluminescence display of the disclosure, a first circuit region and a second circuit region separated upward and downward are arranged around the light emission region of each sub-pixel, and a driving thin film transistor, a sensing thin film transistor, and a switching thin film transistor are disposed in different circuit areas. Accordingly, since the sub-pixels adjacent in the vertical direction can share a power supply line or a sensing line, the number of wiring lines can be reduced, so that the aperture ratio can be improved as much the reduced number of wiring lines.

Further, the storage capacitors are not disposed in the first and second circuit regions except for the light emission region in each sub-pixel. Therefore, it is possible to prevent the decrease of the aperture ratio caused due to the storage capacitor disposed in the first and second circuit areas.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of embodiments of the disclosure. In the drawings:

FIG. 7A is a plan view illustrating a first conductive layer constituting a power supply line and a data line arranged on a substrate;

FIG. 7B is a plan view illustrating a semiconductor layer (ACT) disposed on a buffer layer covering the components shown in FIG. 7A;

FIG. 7C is a plan view illustrating a third conductive layer constituting a scan line and a branch line;

FIG. 7D is a plan view illustrating an anode electrode disposed in a light emission region of each sub-pixel.

DETAILED DESCRIPTION

Figure 1:
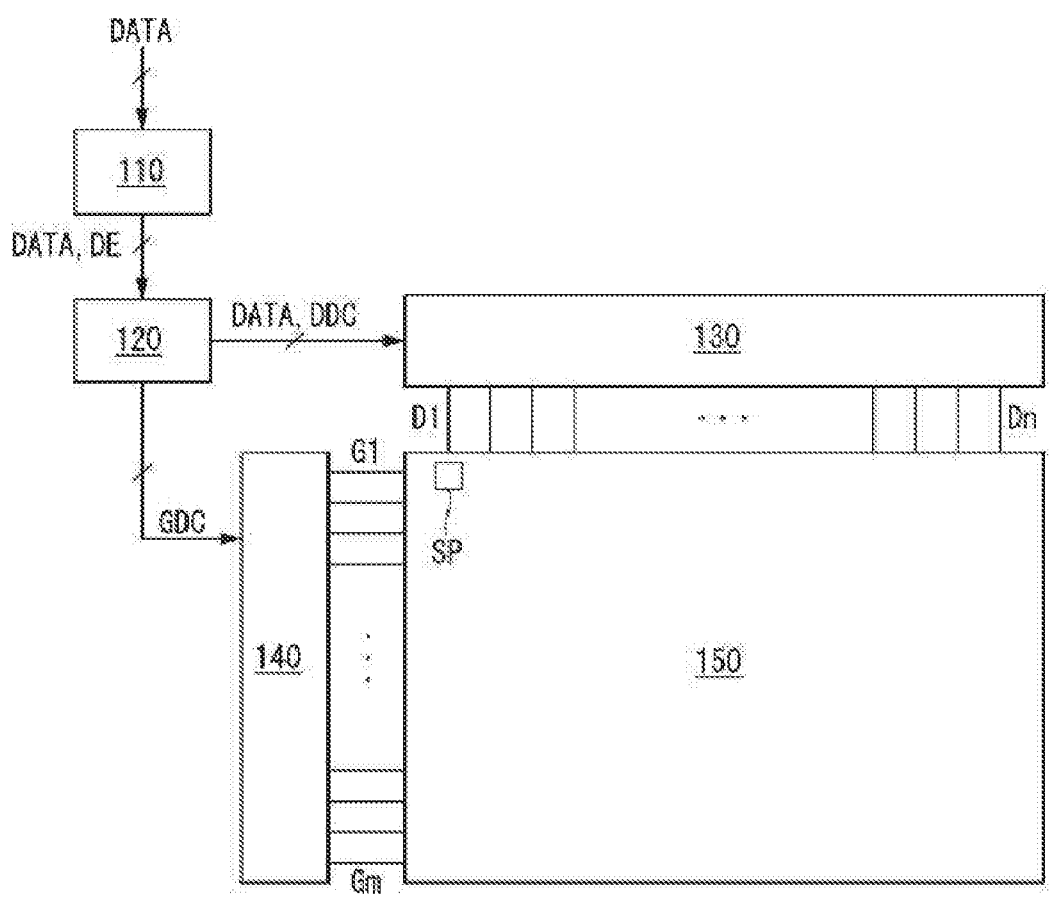
FIG. 1 is a block diagram schematically illustrating an electroluminescence display according to an embodiment of the disclosure.

Hereinafter, a display device according to an embodiment of the disclosure will be described with reference to the accompanying drawings. Like reference numerals throughout the disclosure denote substantially identical components. In the following description, a detailed description of known functions and configurations incorporated herein will be omitted when they may make the subject matter of the disclosure rather unclear.

Hereinafter, an electroluminescence display according to an embodiment of the disclosure will be described with reference to FIG. 1.

FIG. 1 is a block diagram schematically illustrating an electroluminescence display according to an embodiment of the disclosure.

Referring to FIG. 1, the electroluminescence display includes a video processor 110, a timing controller 120, a data driver 130, a scan driver 140, and a display panel 150.

The video processor 110 outputs a data enable signal DE together with a data signal DATA supplied from the outside. The video processor 110 may output at least one of a vertical synchronizing signal, a horizontal synchronizing signal, and a clock signal in addition to the data enable signal DE, but these signals are omitted for convenience of explanation.

The timing controller 120 receives a data signal DATA in addition to the data enable signal DE or driving signals including a vertical synchronizing signal, a horizontal synchronizing signal, and a clock signal from the video processor 110. The timing controller 120 outputs a gate timing control signal GDC for controlling the operation timing of the scan driver 140 and a data timing control signal DDC for controlling the operation timing of the data driver 130 based on the driving signals.

The data driver 130 samples and latches the data signal DATA supplied from the timing controller 120 in response to the data timing control signal DDC supplied from the timing controller 120, converts the sampled data signal into a gamma reference voltage, and outputs it. The data driver 130 outputs the data signal DATA through the data lines D1 to Dn. The data driver 130 may be formed in a type of an integrated circuit (IC).

The scan driver 140 outputs scan signals while shifting the level of the gate voltage in response to the gate timing control signal GDC supplied from the timing controller 120. The scan driver 140 outputs the scan signals through the scan lines G1 to Gm. The scan driver 140 is formed in a type of an integrated circuit (IC) or a gate-in-panel type in the display panel 150.

The display panel 150 displays a video corresponding to the data signal DATA and the scan signal supplied from the data driver 130 and the scan driver 140. The display panel 150 includes sub-pixels SP that operate to display the video.

The sub-pixels are formed in a top emission mode, a bottom emission mode, or a dual emission mode depending on the structure. The sub-pixels SP include a red sub-pixel, a green sub-pixel, and a blue sub-pixel, or a white sub-pixel, a red sub-pixel, a green sub-pixel, and a blue sub-pixel. The sub-pixels SP may have one or more different emission areas depending on the emission characteristics.

Next, referring to FIG. 2 and FIG. 3, the sub-pixel of the electroluminescence display according to an embodiment of the disclosure will be described.

Figure 2:
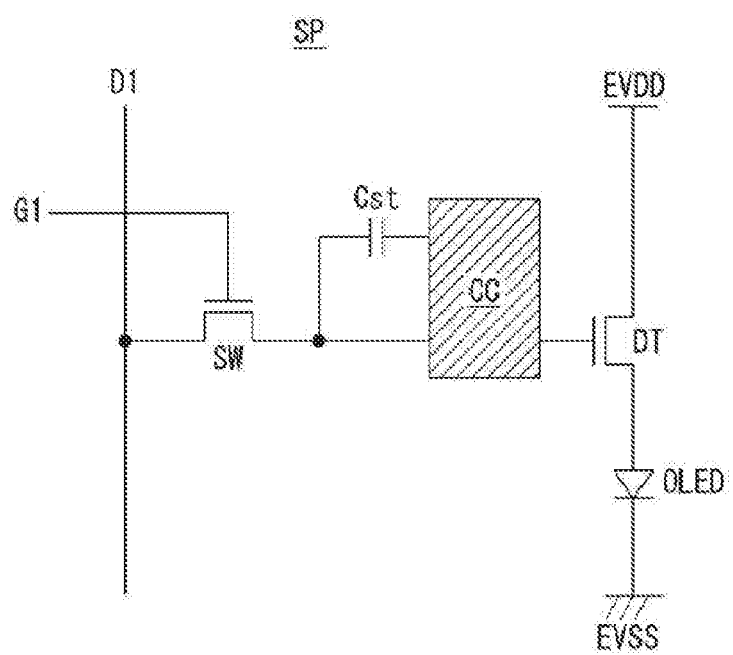
FIG. 2 is a circuit diagram schematically illustrating one example of a sub-pixel of the electroluminescence display shown in FIG. 1.

FIG. 2 is a circuit diagram schematically illustrating one example of a sub-pixel of the electroluminescence display shown in FIG. 1. FIG. 3 is an equivalent circuit diagram illustrating one example of a sub-pixel of the electroluminescence display shown in FIG. 1.

Referring to FIG. 2, one sub-pixel SP constituting the unit-pixel includes a switching thin film transistor SW, a driving thin film transistor DT, a storage capacitor Cst, a compensation circuit CC and an organic light emitting diode OLED.

The switching thin film transistor SW stores a data signal supplied through a first data line D1 to the storage capacitor Cst as a data voltage in response to a scan signal supplied through a first scan line G1. The driving thin film transistor DT operates in accordance with the data voltage stored in the storage capacitor Cst so that a driving current flows between a first power supply line EVDD and a second power supply line EVSS. The organic light emitting diode OLED operates to emit light in accordance with the driving current generated by the driving thin film transistor DT.

The compensation circuit CC is a circuit added in the sub-pixel to compensate a threshold voltage and so on of the driving thin film transistor DT. The compensation circuit CC may comprise one or more thin film transistors. The configuration of the compensation circuit CC may be variously configured in a wide variety of ways depending on the compensation method.

Figure 3:
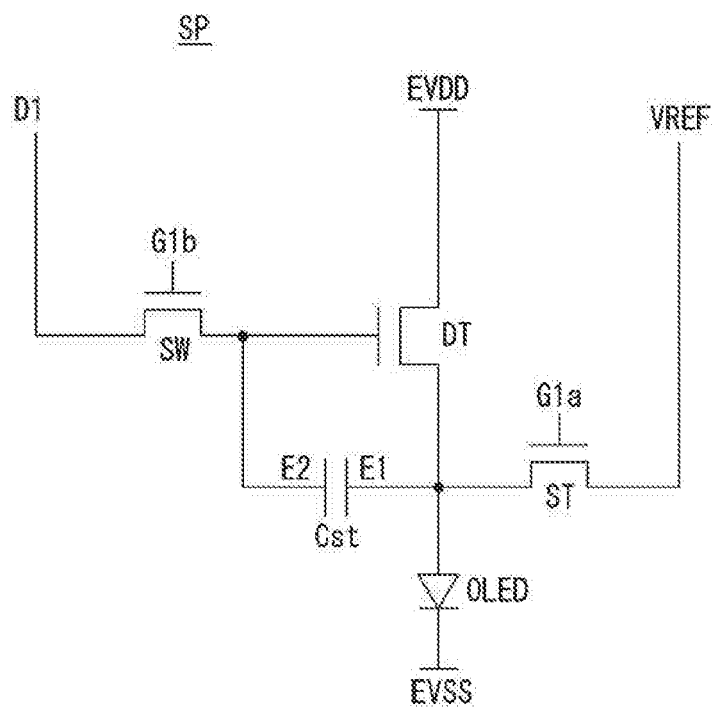
FIG. 3 is an equivalent circuit diagram illustrating one example of a sub-pixel of the electroluminescence display shown in FIG. 1.

Referring to FIG. 3, the compensation circuit CC shown in FIG. 2 includes a sensing thin film transistor ST and a sensing line VREF. The sensing thin film transistor ST is connected between the sensing line VREF and a node (hereinafter referred to as a sensing node) at which a drain electrode of the driving thin film transistor DT and an anode electrode of the organic light emitting diode OLED are connected. The sensing thin film transistor ST operates to supply an initialization voltage (or a sensing voltage) transmitted through the sensing line VREF to the sensing node or to sense the voltage or current of the sensing node.

The switching thin film transistor SW includes a source electrode connected to a first data line D1 and a drain electrode connected to a gate electrode of the driving thin film transistor DT. The driving thin film transistor DT includes a source electrode connected to a first power supply line EVDD and a drain electrode connected to the anode electrode of the organic light emitting diode OLED.

The storage capacitor Cst includes a first electrode E1 connected to the anode electrode of the organic light emitting diode OLED and a second electrode E2 connected to the gate electrode of the driving thin film transistor DT. The second electrode E2 may be formed by making a semiconductor layer conductive.

The organic light emitting diode OLED includes the anode electrode connected to the drain electrode of the driving thin film transistor DT and a cathode electrode connected to the second power supply line EVSS.

The sensing thin film transistor ST includes a source electrode connected to the sensing line VREF and a drain electrode connected to the sensing node to which the anode electrode of the organic light emitting diode OLED is connected.

The operation time of the sensing thin film transistor ST may be similar to, the same as, or different from that of the switching thin film transistor SW according to the compensation algorithm (or the configuration of the compensation circuit). For example, the sensing thin film transistor ST may have a gate electrode connected to a 1a scan line G1a, and the switching thin film transistor SW may have a gate electrode connected to the 1b scan line G1b. As another example, the 1a scan line G1a connected to the gate electrode of the sensing thin film transistor ST and the 1b scan line G1b connected to the gate electrode of the switching thin film transistor SW may be connected to each other.

The sensing line VREF may be connected to the data driver 130. In this case, the data driver 130 can sense the sensing node of the sub-pixel during a non-display period of a real time video, or a N frame (N is an integer of 1 or more) and generate the sensing result. On the other hand, the switching thin film transistor SW and the sensing thin film transistor ST may be turned on at a same time. In this case, the sensing operation through the sensing line (VREF) and the data output operation for outputting the data signal based on a time division method of the data driver 130 are separated (divided) to each other.

In addition, the object to be compensated according to the sensing result may be a digital data signal, an analog data signal, a gamma signal, or the like. The compensation circuit for generating the compensation signal (or the compensation voltage) based on the sensing result may be implemented in the data driver 130, in the timing controller 120, or by a separate circuit.

In the example of FIG. 3, the sub-pixel of 3T1C construction including three thin film transistors consists of the switching thin film transistor SW, the driving thin film transistor DT and the sensing thin film transistor ST, one storage capacitor Cst, and the organic light emitting diode OLED, has been described as an example. However, when a compensation circuit CC is added, each sub-pixel may have constructions of 3T2C, 4T2C, 5T1C, 6T2C, and the like.

Hereinafter, a specific sub-pixel array structure of the electroluminescence display of the disclosure will be described with reference to FIG. 4.

Figure 4:
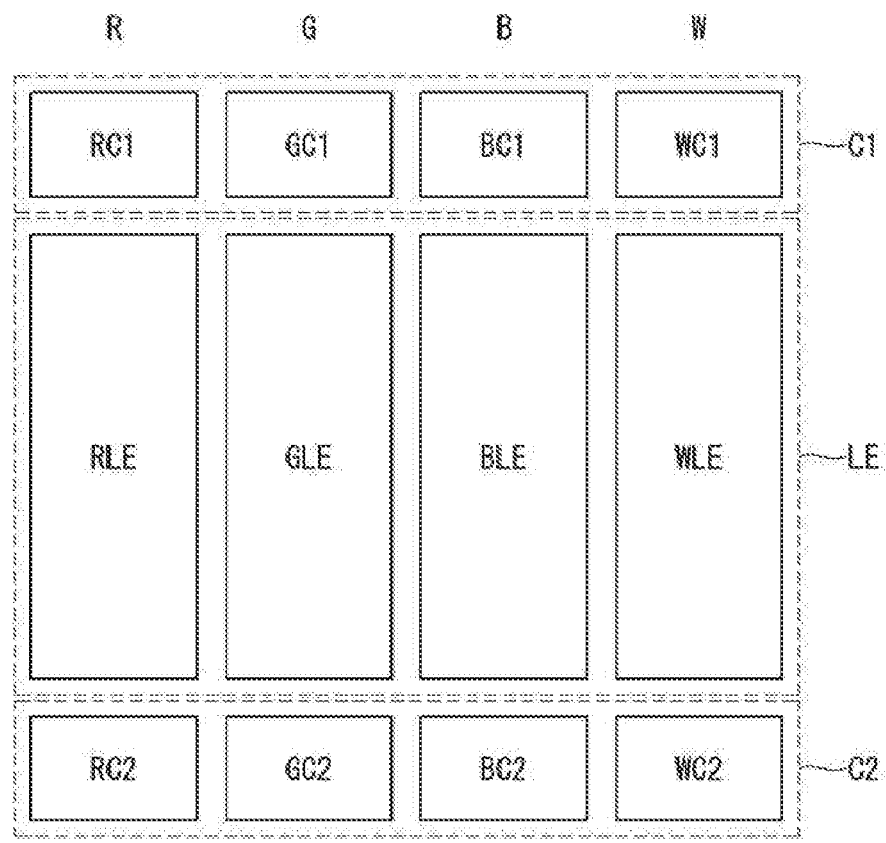
FIG. 4 is a plan view schematically illustrating a unit-pixel constituted by sub-pixels circuits having the equivalent circuit diagram shown in FIG. 3.

FIG. 4 is a plan view schematically illustrating a unit-pixel constituted by sub-pixels circuits having the equivalent circuit diagram shown in FIG. 3.

Referring to FIG. 4, the unit-pixel of the electroluminescence display according to an embodiment of the disclosure may include four sub-pixels. The four sub-pixels may consist of first to fourth sub-pixels including a red sub-pixel R, a green sub-pixel G, a blue sub-pixel B and a white sub-pixel W. In the following description, for convenience of explanation, 3T1C sub-pixel construction will be described as an example.

Each of the first to fourth sub-pixels R, G, B and W includes a light emission region LE and a first circuit region C1 and a second circuit region C2 positioned at upper and lower sides of the light emission region LE, respectively, as shown in FIG. 4. That is, in the electroluminescence display according to an embodiment of the disclosure, the first circuit region C1 and the second circuit region C2 are separated from each other around the light emission region LE in each of the first to fourth sub-pixels R, G, B and W. One of the first and second circuit regions C1, C2 is positioned on one side of the light emission region LE and the other one of the first and second circuit regions C1, C2 positioned on the opposite side of the light emission region LE. In addition, in the electroluminescence display according to an embodiment of the disclosure, the switching thin film transistors SW and the sensing thin film transistors ST included in the sub-pixels arranged at odd-numbered rows may be disposed in the first circuit regions RC1, GC1, BC1 and WC1, respectively. Also, the driving thin film transistors DT included in the sub-pixels arranged at the odd-numbered rows may be disposed in the second circuit regions RC2, GC2, BC2 and WC2, respectively, and the storage capacitors Cst included in the sub-pixels arranged at the odd-numbered rows may be disposed in the light emission regions RLE, GLE, BLE and WLE, respectively. On the other hand, the driving thin film transistors DT included in the sub-pixels arranged at even-numbered rows may be disposed in the first circuit regions RC1, GC1, BC1 and WC1, respectively. Also, the switching thin film transistors SW and the sensing thin film transistor ST included in the sub-pixels arranged at the even-numbered rows may be disposed in the second circuit regions RC2, GC2, BC2 and WC2, respectively, and the storage capacitors Cst included in the sub-pixels arranged at the even-numbered rows may be disposed in the light emission regions RLE, GLE, BLE and WLE, respectively.

Alternatively, the driving thin film transistors DT included in the sub-pixels arranged at odd-numbered rows may be disposed in the first circuit regions RC1, GC1, BC1 and WC1, respectively. Also, the switching thin film transistors SW and the sensing thin film transistors ST included in the sub-pixels arranged at the odd-numbered rows may be disposed in the second circuit regions RC2, GC2, BC2 and WC2, respectively, and the storage capacitors Cst included in the sub-pixels arranged at the odd-numbered rows may be disposed in the light emission regions RLE, GLE, BLE and WLE, respectively. On the other hand, the driving thin film transistors DT included in the sub-pixels arranged at even-numbered rows may be disposed in the second circuit regions RC2, GC2, BC2 and WC2, respectively. Also, the switching thin film transistors SW and the sensing thin film transistor ST included in the sub-pixels arranged at the even-numbered rows may be disposed in the first circuit regions RC1, GC1, BC1 and WC1, respectively, and the storage capacitors Cst included in the sub-pixels arranged at the even-numbered rows may be disposed in the light emission regions RLE, GLE, BLE and WLE, respectively.

In the electroluminescence display according to the disclosure, the sub-pixels of the odd-numbered rows and the even-numbered row include the first circuit regions and the second circuit regions at upper and lower sides of the light emission regions. In addition, the circuit elements disposed in the first circuit regions of the sub-pixels arranged at the odd-numbered rows and the second circuit regions of the sub-pixels arranged at the even-numbered rows are the same, and the circuit elements disposed in the second circuit regions of the sub-pixels arranged at the odd-numbered rows and the circuit elements disposed in the first circuit regions of the sub-pixels arranged at the even-numbered rows are the same. Thus, the sub-pixels arranged at the odd-numbered rows and the sub-pixels in arranged the even-numbered rows can be implemented as a mirror image, so it is possible to obtain effects of increasing the aperture ratio by sharing the wiring line common to the sub-pixels arranged at the odd-numbered rows and the even-numbered rows.

Figure 5:
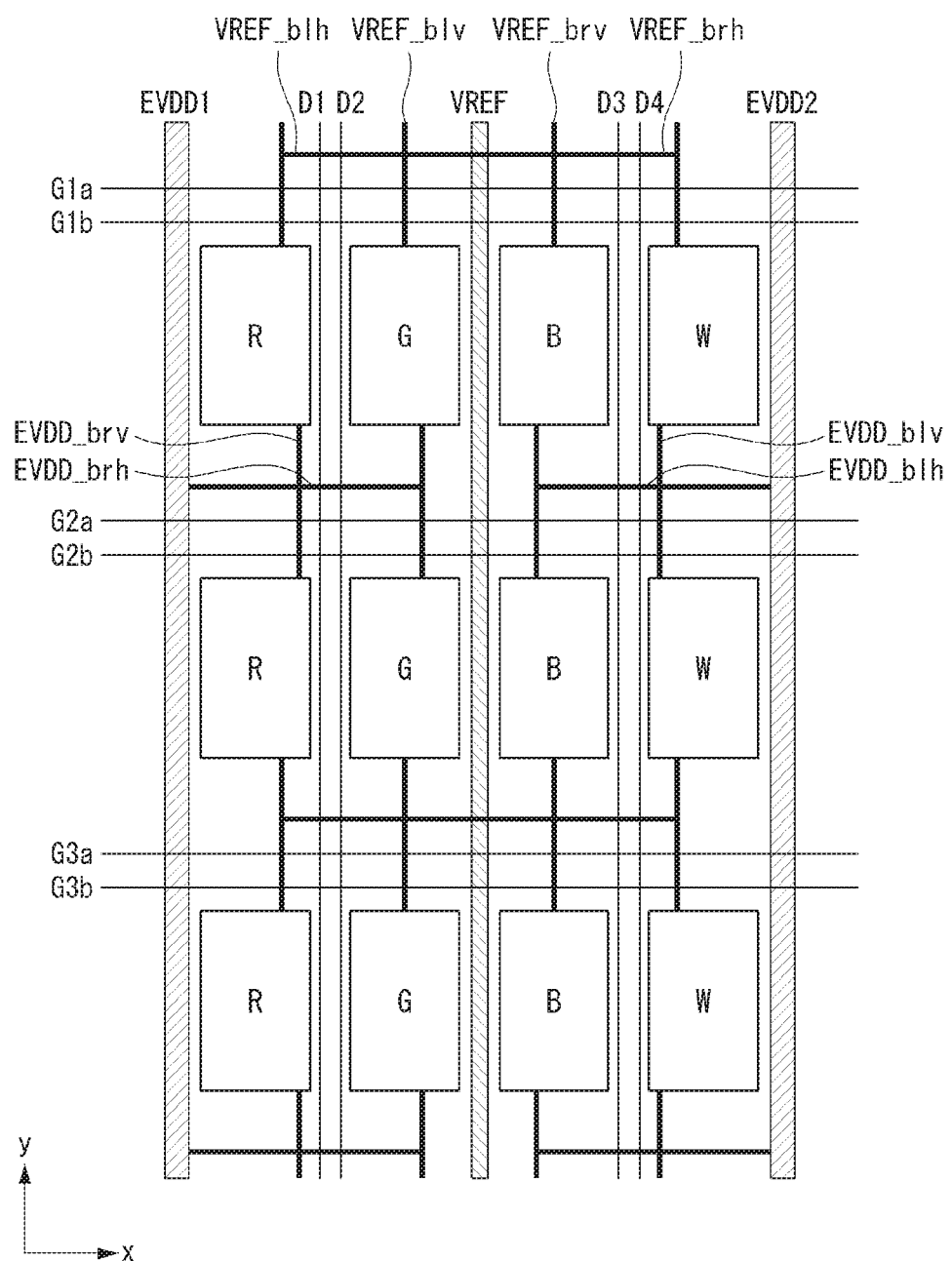
FIG. 5 is a drawing schematically illustrating a relationship between the unit-pixel shown in FIG. 4 and power supply lines and signal supply lines.

FIG. 5 shows the configuration of FIG. 4 in more detail. FIG. 5 is a drawing schematically illustrating a relationship between the sub-pixels R, G, B and W shown in FIG. 4 and power supply lines EVDD, a sensing line VREF and signal supply lines D1 to D4 and G1 to G6.

Referring to FIG. 5, the electroluminescence display according to the disclosure includes the first to fourth sub-pixels R, G, B, and W constituting one unit-pixel, first power supply lines EVDD1 and EVDD2, a sensing line VREF, the data lines D1 to D4 and the scan lines G1a, G1b, G2a, G2b, G3a and G3b.

The first to fourth sub-pixels R, G, B, and W constituting one unit pixel are repeatedly arranged along a first direction (for example, a x-axis direction or row direction) with a predetermined distance therebetween, to form one row. The sub-pixels arranged in one row are repeatedly arranged along a second direction (e.g., a y-axis direction or column direction) crossing the first direction. Accordingly, it is possible to implement a pixel array including the sub-pixels R, G, B and W arranged in a plurality of rows.

The first power supply lines EVDD1 and EVDD2 are arranged to be spaced from a predetermined distance along the first direction, and extended along the second direction. Each of the first power supply lines EVDD1 and EVDD2 includes a first horizontal power supply branch line EVDD_blh extended in a left-hand side along the first direction and a first vertical power supply branch line (EVDD_blv) extended along the second direction from the first horizontal power supply branch line EVDD_blh. Each of the first power supply lines EVDD1 and EVDD2 also includes a second horizontal power supply branch line EVDD_brh extended in a right-hand side along the first direction and a second vertical power supply branch line (EVDD_brv) extended along the second direction from the second horizontal power supply branch line EVDD_brh.

If the sub-pixels are not arranged on the left-hand side or the right-hand side of the first power supply lines EVDD1 and EVDD2, the first horizontal power supply branch line EVDD_blh and the first vertical power supply branch line EVDD_blv or the second horizontal power supply branch line EVDD_brh and the second vertical power supply branch line EVDD_brv may not be formed.

If there are sub-pixels at the upper and lower sides of the first horizontal power supply branch line EVDD_blh and the second horizontal power supply branch line EVDD_brh, the first vertical power supply branch line EVDD_blv and the second vertical power supply branch line EVDD_brv may extend in the vertical direction about the first horizontal power supply branch line EVDD_blh and the second horizontal power supply branch line EVDD_brh.

The first horizontal power supply branch line EVDD_blh, the second horizontal power supply branch line EVDD_brh, the first vertical power supply branch line EVDD_blv and the second vertical power supply branch line EVDD_brv may be disposed at one side of the sub-pixels arranged at the odd-numbered row (e.g., the lower side of the sub-pixels disposed on the first row shown in FIG. 5).

For example, the second vertical power supply branch line EVDD_brv connected to the left first power supply line EVDD1 and arranged below first and second sub-pixels R and G disposed at a first odd-numbered row may be connected to the driving thin film transistors arranged in the second circuit regions of the first and second sub-pixels R and G of the first row and the driving thin film transistors disposed in the first circuit regions of the first and second sub-pixels R and G of the second row.

Also, the first vertical power supply branch line EVDD_blv connected to the right first power supply line EVDD2 and arranged below third and fourth sub-pixels B and W disposed at the first odd-numbered row may be connected to the driving thin film transistors arranged in the second circuit regions of the third and fourth sub-pixels B and W of the first row and the driving thin film transistors disposed in the first circuit regions of the third and fourth sub-pixels B and W of the second row.

In this way, each of the first vertical power supply branch line EVDD_blv and the second vertical power supply branch line EVDD_brv is connected to the driving thin film transistors disposed in the sub-pixels of the upper side or lower side thereof.

The sensing line VREF is disposed between the first power source lines EVDD1 and EVDD2 and extends along the second direction. The sensing line VREF is arranged such that the first and second sub-pixels R and G are disposed between the sensing line VREF and the odd-numbered first power supply line EVDD1, and the third and fourth sub-pixels B and W are disposed between the sensing line VREF and the even-numbered first power supply line EVDD2.

The sensing line VREF may include a first horizontal sensing branch line VREF_blh extended to the left-hand side along the first direction and the first vertical sensing branch line VREF_blv extended the first horizontal sensing branch line VREF_blh along the second direction from the first horizontal sensing branch line VREF_blh. The sensing line VREF may also include a second horizontal sensing branch line VREF_brh extended to the right-hand side along the first direction and a second vertical sensing branch line VREF_brv extended from the second horizontal sensing branch line VREF_brh along the second direction.

The first vertical sensing branch line VREF_blv and the second vertical sensing branch line VREF_brv may be extended in upper and lower directions about the first horizontal sensing branch line VREF_blh and the second horizontal sensing branch line VREF_brh if there are sub-pixels on both the upper and lower sides of the first horizontal sensing branch line VREF_blh and the second horizontal sensing branch line VREF_brh.

The first horizontal sensing branch line VREF_blh, the second horizontal sensing branch line VREF_brh, the first vertical sensing branch line VREF_blv and the second vertical sensing branch line VREF_brv are disposed at one side of the sub-pixels arranged at the odd-numbered row (e.g., the upper side of the sub-pixels disposed at the first row of FIG. 5) or one side of the sub-pixels arranged at the even-numbered rows (e.g., the lower side of the sub-pixels disposed at the second row of FIG. 5).

For example, the first vertical sensing branch lines VREF_blv arranged at upper side of the first and second sub-pixels R and G of the first odd-numbered row are connected to the sensing thin film transistors disposed in the first circuit regions of the sub-pixels R and G of the first odd-numbered row. Also, the second vertical sensing branch lines VREF_brv arranged at upper side of the third and fourth sub-pixels B and W of the first odd-numbered row are connected to the sensing thin film transistors disposed in the first circuit regions of the sub-pixels B and W of the first odd-numbered row.

The first vertical sensing branch lines VREF_blv arranged at upper side of the first and second sub-pixels R and G of the second odd-numbered row (i.e., a third row) are connected to the sensing thin film transistors disposed in the first circuit regions of the sub-pixels R and G of the third row and the sensing thin film transistors disposed in the second circuit regions of the sub-pixels R and G of the second row.

Also, the second vertical sensing branch lines VREF_brv arranged at upper side of the third and fourth sub-pixels B and W of the third row are connected to the sensing thin film transistors disposed in the first circuit regions of the third and fourth sub-pixels B and W of the third row and the sensing thin film transistors disposed in the second circuit regions of the third and fourth pixels B and W of the second row.

In this way, each of the first vertical sensing branch line VREF_blv and the second vertical sensing branch line VREF_brv may be connected to the sensing thin film transistors in the sub-pixels disposed at the upper side or the lower sides thereof.

The data lines D1 to D4 may be arranged in parallel between the first and second sub-pixels R and G and between the third and fourth sub-pixels B and W to be extended along the second direction. That is, the first data line D1 and the second data line D2 are arranged in parallel between the first sub-pixels R and the second sub-pixels G. The third data line D3 and the fourth data line D4 may be arranged in parallel between the third sub-pixels B and the fourth sub-pixels W.

The first data line D1 may be connected to the switching thin film transistors SW in the first circuit regions of the first sub-pixels R disposed at the odd-numbered rows and the switching thin film transistors SW in the second circuit regions of the first sub-pixels R disposed at the even-numbered rows.

Similarly, the second data line D2 may be connected to the switching thin film transistors SW in the first circuit regions of the second sub-pixels G disposed at the odd-numbered rows and the switching thin film transistors SW in the second circuit regions of the second sub-pixels G disposed at the even-numbered rows.

The third data line D3 may be connected to the switching thin film transistors SW in the first circuit regions of the third sub-pixels B disposed at the odd-numbered rows and the switching thin film transistors SW in the second circuit regions of the third sub-pixels B disposed at the even-numbered rows.

The fourth data line D4 may be connected to the switching thin film transistors SW in the first circuit regions of the fourth sub-pixels W disposed at the odd-numbered rows and the switching thin film transistors SW in the second circuit regions of the fourth sub-pixels W disposed at the even-numbered rows.

The scan lines G1$a$, G1$b$, G2$a$, G2$b$, G3$a$ and G3$b$ are arranged to be extended along the first direction and to be in parallel along the second direction at one side (for example, the upper side) of the sub-pixels in each row. The scan lines G1$a$, G1$b$, G2$a$, G2$b$, G3$a$ and G3$b$ may be arranged at the upper side of the sub-pixels in one row. For example, the first and second scan lines G1$a$ and G1$b$ are arranged in parallel with each other at the upper side of the sub-pixels of the first row, the third and fourth scan lines G2$a$ and G2$b$ are arranged in parallel with each other at the upper side of the sub-pixels of the second row, and the fifth and sixth scan lines G3$a$ and G3$b$ are arranged in parallel with each other at the upper side of the sub-pixels of the third row.

In the electroluminescence display according to the disclosure, the first circuit regions and the second circuit regions are separately disposed at the upper and lower sides of the light emission region for each sub-pixel. And the first power supply lines EVDD1 and EVDD2 and the sensing line VREF may be connected to the corresponding sub-pixels disposed at the upper and lower sides thereof by the corresponding branch lines. Thus, it is possible to reduce the number of wirings, thereby improving the aperture ratio because the sub-pixels adjacent in the vertical direction can share the first power supply line and the sensing line.

Next, referring to FIGS. 6 to 8, the sub-pixel structure of the electroluminescence display according to an embodiment of the disclosure will be described in more detail.

Figure 6:
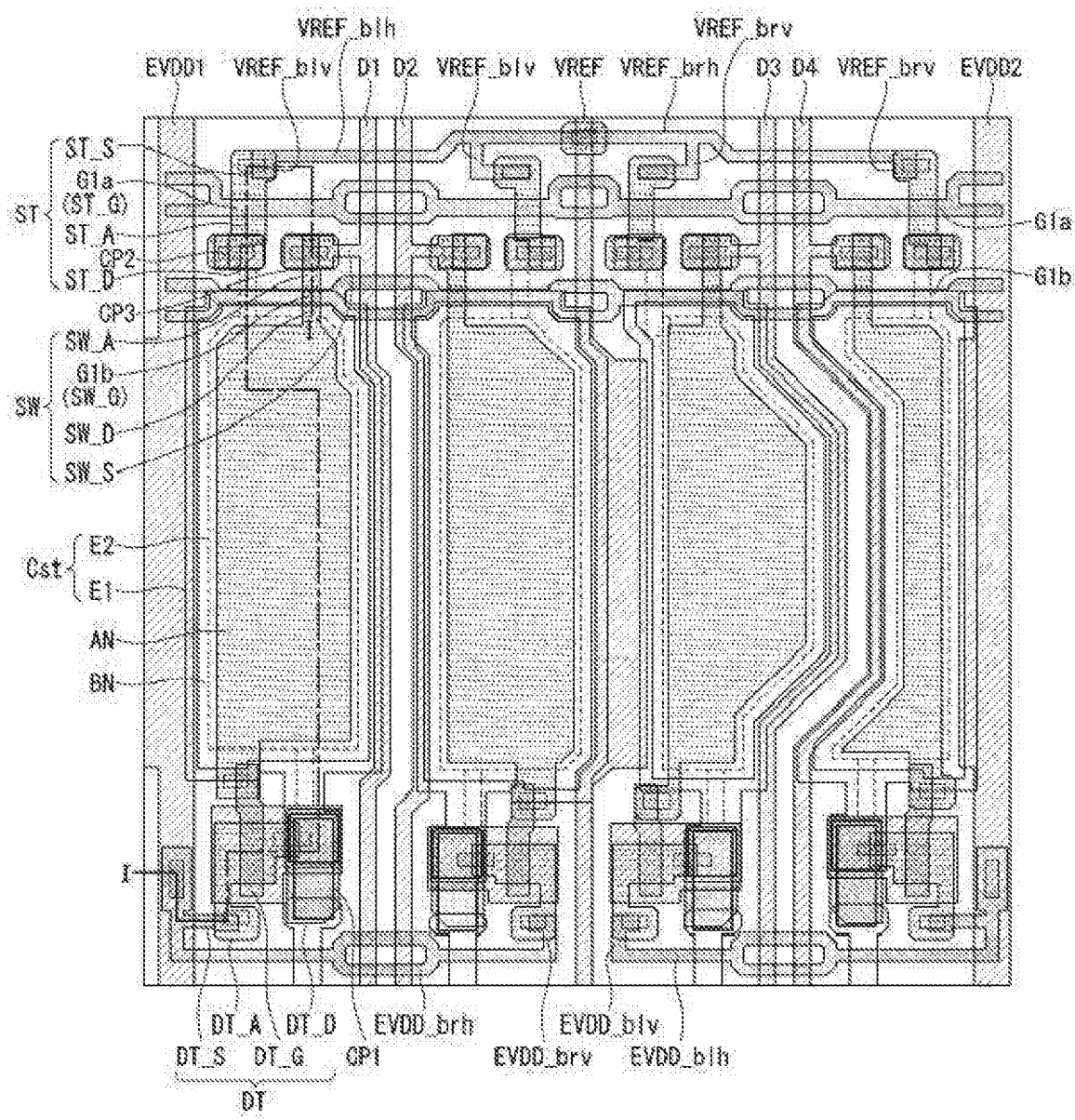
FIG. 6 is a plan view illustrating a unit-pixel of the electroluminescence display according to an embodiment of the disclosure.
Figure 7A:
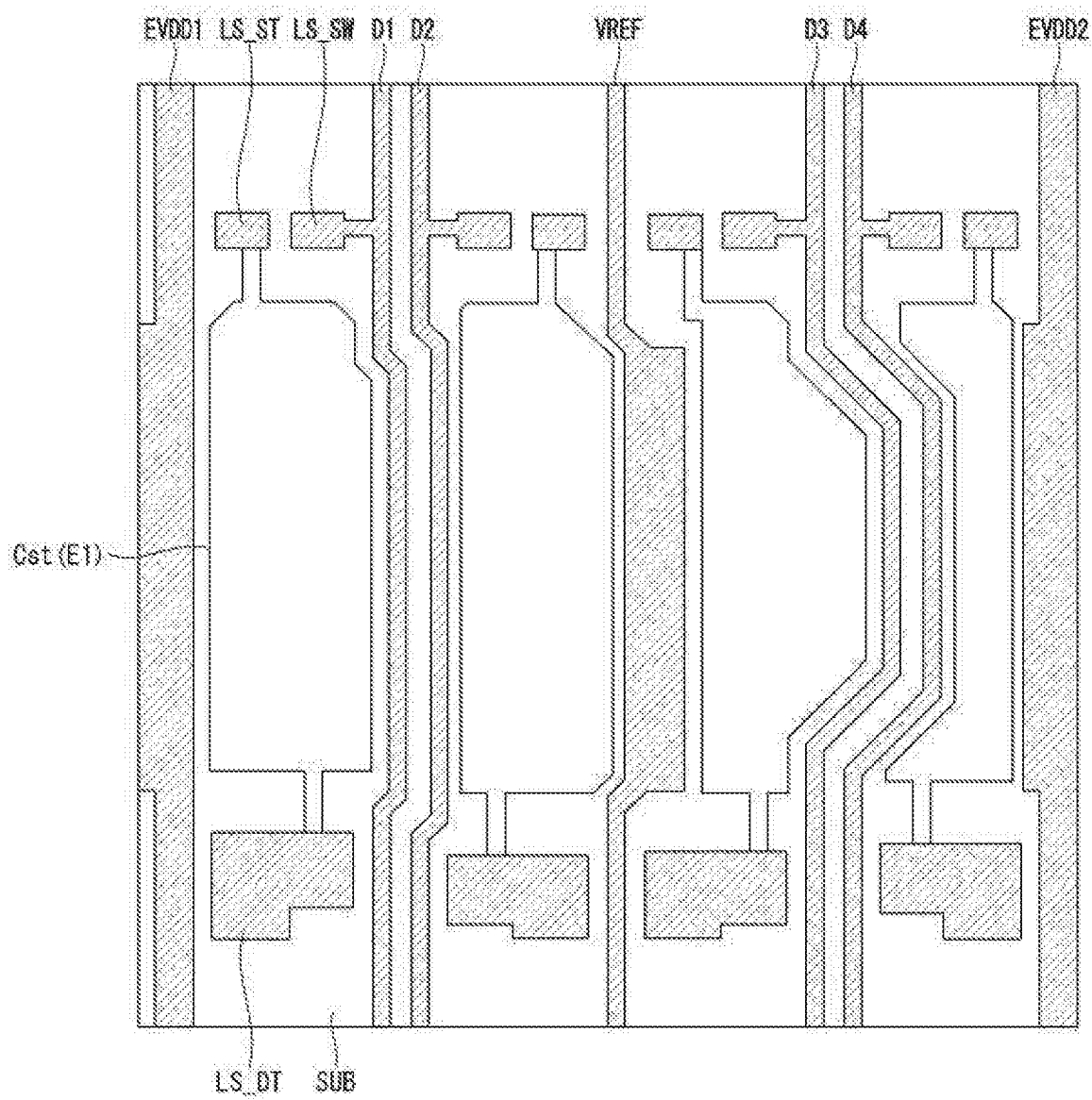
FIGS. 7A to 7D are plan views illustrating layer structures of the unit-pixel shown in FIG. 6.
Figure 7B:
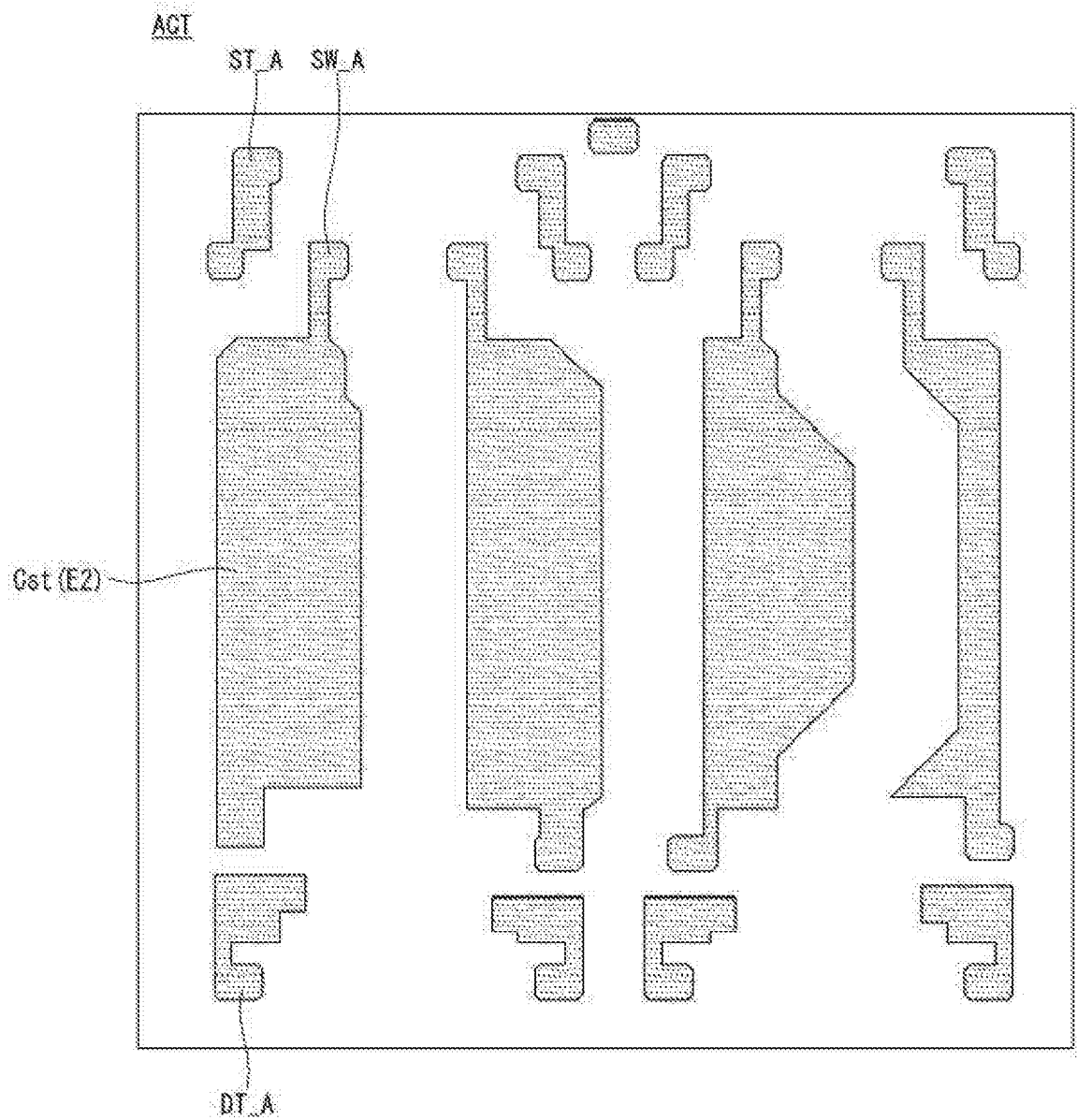
Figure 7C:
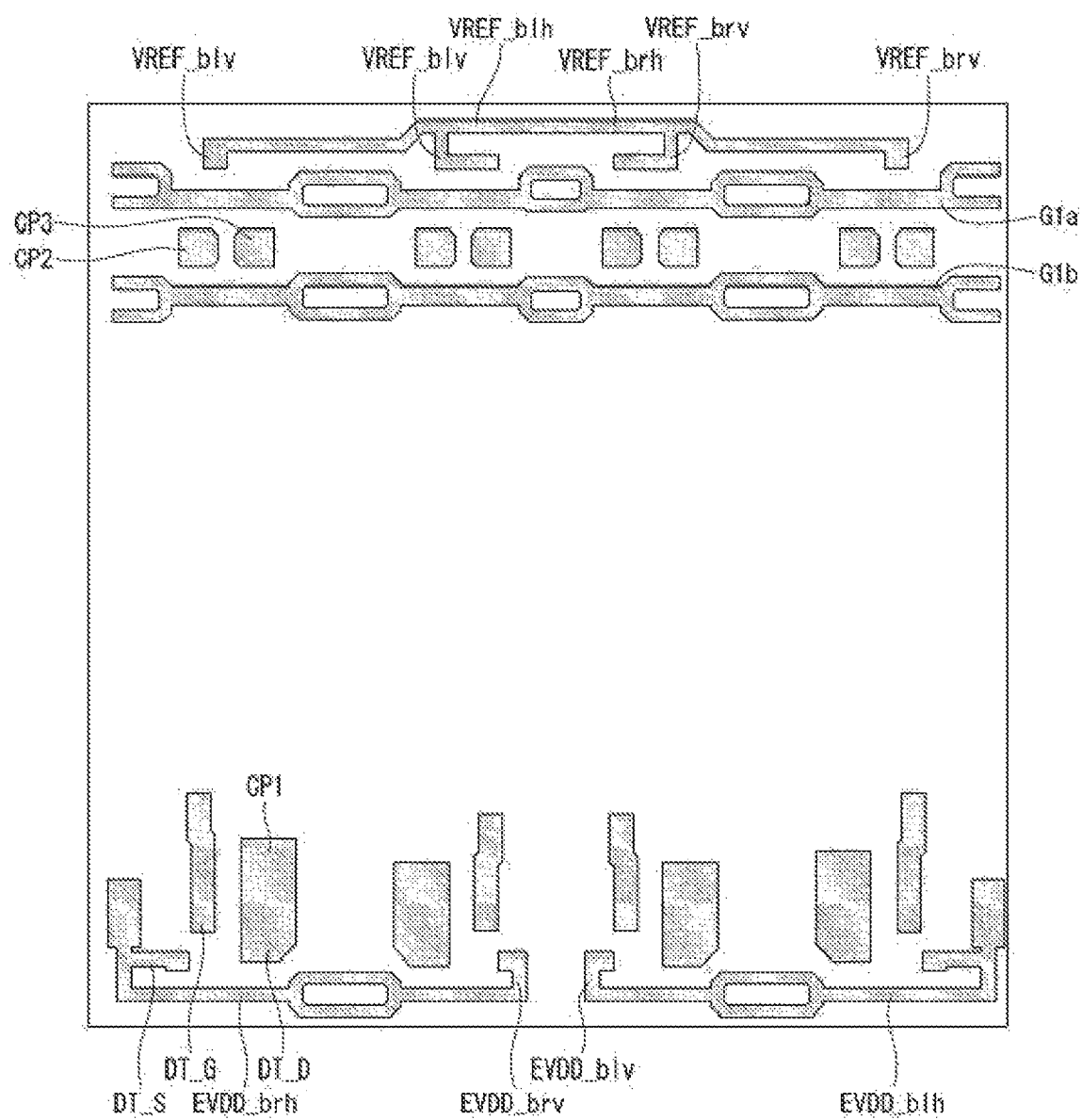
Figure 7D:
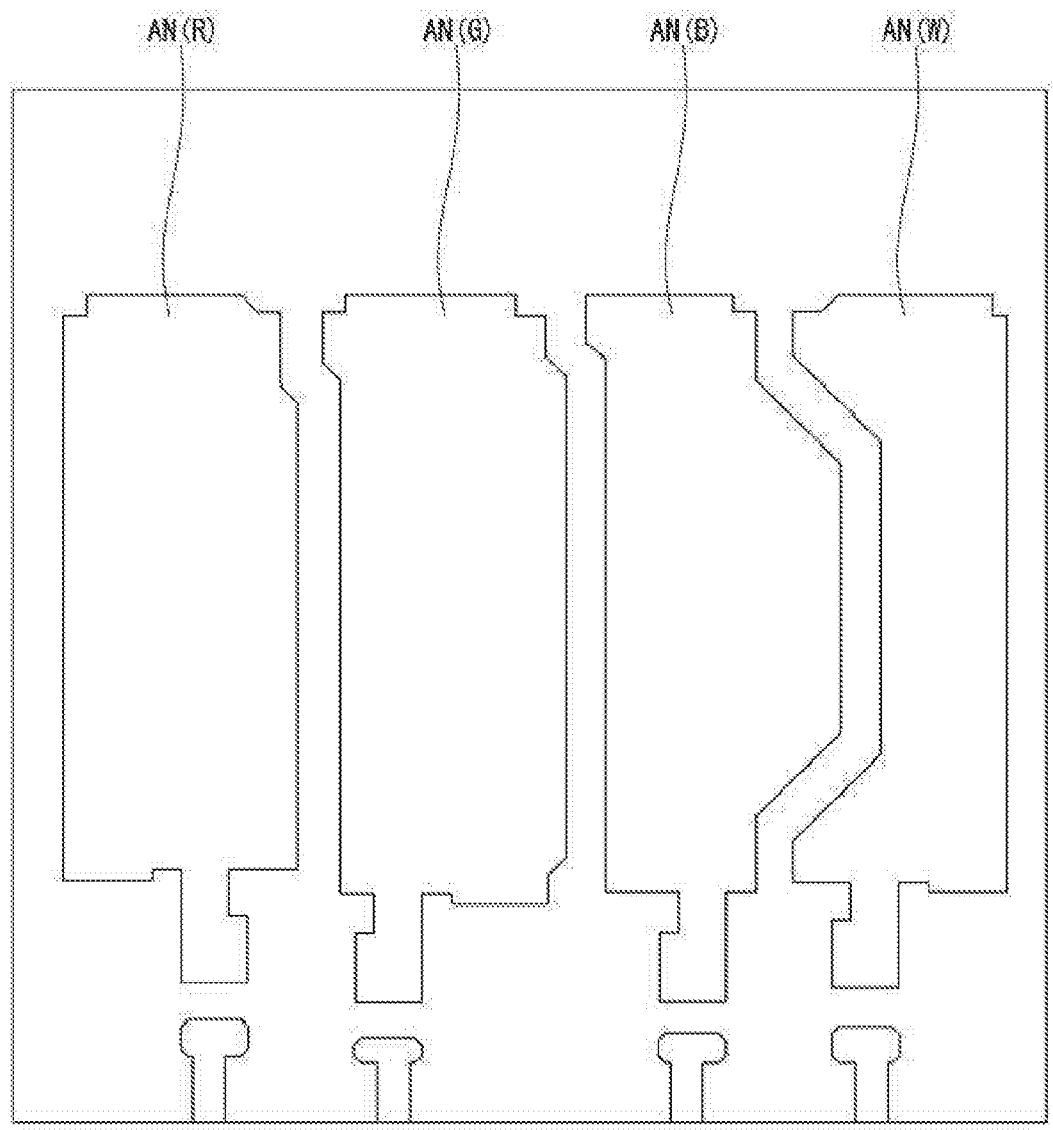

FIG. 6 is a plan view illustrating a unit-pixel of the electroluminescence display according to an embodiment of the disclosure. FIGS. 7A to 7D are plan views illustrating layer structures of the unit-pixel shown in FIG. 6. FIG. 7A is a plan view illustrating a first conductive layer constituting a power supply line and a data line arranged on a substrate. FIG. 7B is a plan view illustrating a semiconductor layer (ACT) disposed on a buffer layer covering the components shown in FIG. 7A. FIG. 7C is a plan view illustrating a third conductive layer constituting a scan line and a branch line. FIG. 7D is a plan view illustrating an anode electrode disposed in a light emission region of each sub-pixel. FIG. 8 is a cross-sectional view taken along the line I-I' of FIG. 6.

Referring to FIG. 5 and FIGS. 6 to 8, the electroluminescence display according to an embodiment of the disclosure includes first through fourth sub-pixels R, G, B, and W constituting one unit-pixel.

Each of the sub-pixels R, G, B and W includes a emission region in which the storage capacitor Cst, the color filter CF and the organic light emitting diode OLED are disposed, a first circuit region disposed at one side (for example, an upper side) of the light emission region and including a sensing thin film transistor ST and a switching thin film transistor SW, and a second circuit region disposed at the other side (for example, a lower side) of the light emission region and including a driving thin film transistor DT.

There are a first scan line G1a supplying a first scan signal to the sensing thin film transistor ST and a second scan line G1b supplying a second scan signal to the switching thin film transistor SW at the one side (for example, the upper side) of the sub-pixels disposed at a same row.

The first to fourth sub-pixels R, G, B and W constituting one unit pixel are may be bounded from unit-pixels neighboring thereto by the first power supply lines EVDD1 and EVDD2. In other words, a left first power source line EVDD1 may be arranged at a left side of the first sub-pixels R disposed along the second direction (column direction), and a right first power source line EVDD2 may be arranged at a right side of the fourth sub-pixels W disposed along the column direction. The left first power supply line EVDD1 may include a second horizontal power branch line EVDD_brh and a second vertical power branch line EVDD_brv. The left second horizontal power branch line EVDD_brh may be extended to a right-hand side along a horizontal direction. The second vertical power branch line EVDD_brv may be extended from the second horizontal power branch line EVDD_brh in parallel with the left first power source line EVDD1 and connected to the driving thin film transistor DT of the sub-pixels disposed at the upper side and/or the lower side of the second horizontal power branch line EVDD_brh. The right first power supply line EVDD2 may include a first horizontal power branch line EVDD_blh and a first vertical power branch line EVDD_blv. The first horizontal power branch line EVDD_blh may be extended to a left-hand side along the horizontal direction. The first vertical power branch line EVDD_blv may be extended from the first horizontal power branch line EVDD_blh in parallel with the right first power source line EVDD2 and connected to the driving thin film transistor DT of the sub-pixels disposed at the upper side and/or the lower side upper of the first horizontal power branch line EVDD_blh.

There may be first and second data lines D1 and D2 in parallel with each other between the first sub-pixels R and the second sub-pixels G disposed in the column direction. The first data line D1 may supply data signal to the switching thin film transistors SW of the first sub-pixels R disposed at the left-hand side thereof. The second data line D2 may supply data signal to the switching thin film transistors SW of the second sub-pixels G disposed at the right-hand side thereof.

There may be the third and fourth data lines D3 and D4 in parallel with each other between the third sub-pixels B and the fourth sub-pixels W disposed in the column direction. The third data line D3 may supply data signal the switching thin film transistors SW of the third sub-pixels B disposed at the left-hand side thereof. The fourth data line D4 may supply data signal to the switching thin film transistors SW of the fourth sub-pixels W disposed at the right-hand side thereof.

There may be a sensing line VREF arranged to be extended along the column direction between the second sub-pixels G and the third sub-pixels B.

The sensing line VREF may include a first horizontal sensing branch line VREF_blh and a first vertical sensing branch line VREF_blv. The first horizontal sensing branch line VREF_blh may be extended from the sensing line VREF to the left-hand side along the horizontal direction. The first vertical sensing branch line VREF_blv may be connected to the sensing thin film transistors ST of the first and second sub-pixels R and G disposed at the upper side and/or the lower side of the first horizontal sensing branch line VREF_blh.

The sensing line VREF may also include a second horizontal sensing branch line VREF_brh and a second vertical sensing branch line VREF_brv. The second horizontal sensing branch line VREF_brh may be extended from the sensing line VREF to the right-hand side along the horizontal direction. The second vertical sensing branch line VREF_brv may be connected to the sensing thin film transistors ST of the third and fourth sub-pixels B and W disposed at the upper side and/or the lower side of the second horizontal sensing branch line VREF_brh.

Figure 8:
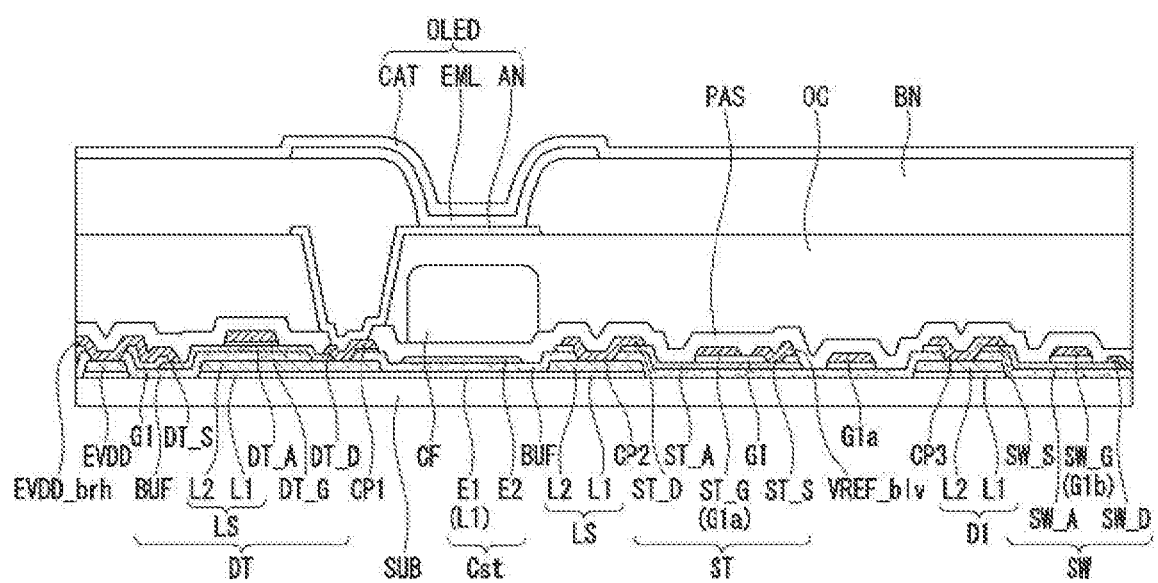
FIG. 8 is a cross-sectional view taken along the line I-I' of FIG. 6.

Referring to FIGS. 6, 7A and 8, there are the first power supply lines EVDD1 and EVDD2, the first and second data lines D1 and D2, the sensing line VREF, and the third and fourth data lines D3 and D4 on a substrate SUB. The first power supply lines EVDD1 and EVDD2 are arranged in parallel along a first direction (for example, x-axis direction or column direction) and extended in a second direction (for, example, y-axis direction or row direction) crossing the first direction. The first and second data lines D1 and D2 are neighbored to and in parallel with each other between the first power supply lines EVDD1 and EVDD2. The sensing line VREF is disposed between the second data line D2 and the third data line D3 and in parallel therewith. The third and fourth data lines D3 and D4 are disposed between the sensing line VREF and the right first power supply line EVDD2 and in parallel therewith.

The first data line D1 may be disposed at a predetermined distance from the left first power supply line EVDD1 so that the first subpixel R may be positioned between the first data line D1 and the left first power supply line EVDD1. The second data line D2 may be disposed adjacent to the first data line D1.

The sensing line VREF is arranged at a predetermined distance from the second data line D2 and the third data line D3 such that the second subpixel G is positioned between the sensing line VREF and the second data line D2 and the third subpixel B is positioned between the sensing line VREF and the third data line D3.

The third and fourth data lines D3 and D4 may be disposed adjacent to each other. The fourth data line D4 may be disposed at a predetermined distance from the right first power supply line EVDD2 so that the fourth subpixel W may be positioned between the fourth data line D3 and the right first power supply line EVDD2.

There are first circuit regions RC1, GC1, BC1 and WC1 and second circuit regions RC2, GC2, BC2 and WC2 between the left power supply line EVDD1 and the first data line D1, the second data line D2 and the sensing line VREF, the sensing line VREF and the third data line D3, and the fourth data line D4 and the right power supply line EVDD2, respectively. The first circuit regions RC1, GC1, BC1 and WC1 are disposed at the upper side of emission regions RLE, GLE, BLE and WLE of the first to fourth sub-pixels R, G, B and W, respectively. The second circuit regions RC2, GC2, BC2 and WC2 are disposed at the lower side of emission regions RLE, GLE, BLE and WLE of the first to fourth sub-pixels R, G, B and W, respectively.

There may be first light shield patterns LS_ST corresponding to the sensing thin film transistors ST and second light shield patterns LS_SW corresponding to the switching thin film transistors SW in the regions corresponding to the first circuit regions RC1, GC1, BC1, and WC1 of the first to fourth sub-pixels R, G, B and W, respectively.

There may be first electrodes E1 of the storage capacitors Cst in the regions corresponding to the light emission regions RLE, GLE, BLE and WLE of the first to fourth sub-pixels R, G, B and W, respectively.

There may be third light shied patterns LS_DT in the regions corresponding to the second circuit regions RC2, GC2, BC2, and WC2 of the first to fourth sub-pixels R, G, B and W, respectively.

The first to third light shied patterns LS_ST, LS_SW and LS_DT protect the sensing thin film transistor ST, the switching thin film transistor SW and the driving thin film transistor DT by shielding the light input to channel areas thereof, respectively.

The second light shield pattern LS_SW may be extended from each of the first to fourth data lines D1, D2, D3, and D4. The first light shield pattern LS_ST, the third light-shielding pattern LS_DT, and the first electrode E1 of the storage capacitor Cst may be electrically connected to each other and may be formed to be separated from the first power supply lines EVDD1 and EVDD2 and the first to fourth data lines D1 to D4.

Each of the first power supply lines EVDD1 and EVDD2, the data lines D1 to D4, the first light shield pattern LS_ST, the second light shield pattern LS_SW, and the third light shield pattern LS_DT may have a double layer of a transparent conductive layer L1 formed on the substrate SUB and a metal layer L2 formed on the transparent conductive layer L1.

The first electrode E1 of the storage capacitor Cst is formed of the transparent conductive layer L1 and disposed in each of the light emission regions RLE, GLE, BLE, and WLE. The first electrode E1 of the storage capacitor Cst can electrically connect the transparent conductive layer L1 of the first light-shielding pattern LS_ST to the transparent conductive layer L1 of the third light-shielding pattern LS_DT.

Referring to FIG. 8, a buffer layer BUF may be disposed on the substrate SUB on which the components shown in FIG. 7A are formed to cover the components. The buffer layer BUF protects thin film transistors formed in a subsequent process from impurity such as alkaline ions flowing out from the first to third light shield patterns LS_ST, LS_SW, and LS_DT or the substrate SUB. The buffer layer BUF may have silicon oxide (SiOx) layer, silicon nitride (SiNx) layer, or multiple layers thereof.

Referring to FIGS. 6, 7B, and 8, a semiconductor layer ACT may be disposed on the buffer layer BUF. The semiconductor layer (ACT) may be formed of a silicon semiconductor or an oxide semiconductor. The silicon semiconductor may include amorphous silicon or crystallized polycrystalline silicon. Here, the polycrystalline silicon has high mobility (100 cm$^2$/Vs or more), low energy consumption power and excellent reliability, and can be applied to a gate driver for a driving device and/or a multiplexer. The polycrystalline silicon can also be applied to the driving thin film transistor in the pixels.

On the other hand, since the oxide semiconductor has low off-current, it is suitable for a switching thin film transistor which has a short ON time and a long off time. Further, it is suitable for a display device requiring low speed driving and/or low power consumption because the off current is small and a voltage holding period of the pixel is long.

Further, the semiconductor layer ACT includes drain and source regions including a p-type or n-type impurity and a channel region therebetween.

The semiconductor layer ACT includes a sensing semiconductor layer ST_A of the sensing thin film transistor ST and a switching semiconductor layer SW_A of the switching thin film transistor SW disposed in the regions corresponding to the first circuit areas RC1, GC1, BC1, and WC1 of the sub-pixels R, G, B, and W shown in FIG. 4. The semiconductor layer ACT includes also a driving semiconductor layer DT_A of the driving thin film transistor DT disposed in the regions corresponding to the second circuit areas RC2, GC2, BC2, and WC2 of the sub-pixels R, G, B, and W, and a light emitting semiconductor layer disposed in the regions corresponding to the light emission regions of the first to fourth sub-pixels R, G, B, and W. The light emitting semiconductor layer may form a second electrode E2 of the transparent storage capacitor Cst by making conductive a semiconductor layer in the light emission regions. The second electrode E2 of the transparent storage capacitor Cst may be connected to the switching semiconductor layer SW_A of the switching thin film transistor SW. Therefore, the second electrodes E2 of the storage capacitors Cst are disposed in the regions corresponding to the light-emitting regions RLE, GLE, BLE, and WLE of the first to fourth sub-pixels R, G, B, and W, respectively, to be corresponded to the first electrode E1 of the storage capacitor Cst.

Referring to FIG. 8, a gate insulating film GI may be disposed on the buffer layer BUF such that a part of the semiconductor layer ACT and a part of the buffer layer BUF are exposed. The gate insulating film GI include a silicon oxide (SiOx), a silicon nitride (SiNx), or a multilayer thereof.

Referring to FIGS. 6, 7C and 8, on the buffer layer BUF and the gate insulating film GI, the first horizontal sensing branch lines VREF_blh, a second horizontal sensing branch line VREF_brh, first and second gate lines G1a and G1b are arranged to cross the first circuit regions RC1, GC1, BC1 and WC1 of the sub-pixels R, G, B, and W. The first and second sensing branch lines VREF_blh and VREF_blv, and the first and second gate lines G1a and G1b may be arranged in parallel to each other along the second direction.

The first horizontal sensing branch line VREF_blh may be arranged to be positioned in the first circuit regions RC1 and GC1 of the first and second sub-pixels R and G. At least one first vertical sensing branch line VREF_blv is extended from the first horizontal sensing branch line VREF_blh toward the first scan line G1a.

The second horizontal sensing branch line VREF_brh may be arranged to be positioned in the first circuit regions BC1 and WC1 of the third and fourth sub-pixels B and W. At least one second vertical sensing branch line VREF_brv is extended from the second horizontal sensing branch line VREF_brh toward the first scan line G1a.

Second and third connection patterns CP2 and CP3 may be disposed between the first scan line G1a and the second scan line G1b. The second connection pattern CP2 connects a drain electrode of sensing thin film transistor ST to a first electrode E1 of the storage capacitor Cst, which will be described later. The third connection pattern CP3 connects a data line to a source electrode SW_S of the switching thin film transistor SW.

Also, on the buffer layer BUF and the gate insulating film GI, the second horizontal power supply branch lines EVDD_brh, a first horizontal power supply branch line EVDD_blh are arranged to cross the second circuit regions RC2, GC2, BC2 and WC2 of the sub-pixels R, G, B, and W.

The second horizontal power supply branch lines EVDD_brh are arranged to cross the second circuit regions RC2 and GC2 of the sub-pixels R and G, and the first horizontal power supply branch line EVDD_blh are arranged to cross the second circuit regions BC2 and WC2 of the sub-pixels B and W. The second horizontal power supply branch lines EVDD_brh and the first horizontal power supply branch line EVDD_blh are separated from each other on a same line. At least one first vertical sensing branch line VREF_brv is extended from the second horizontal power supply branch line EVDD_brh toward the first and second emission regions RLE and GLE. At least one second vertical sensing branch line VREF_blv is extended from the second horizontal power supply branch line VREF_blh toward the third and fourth emission regions BLE and WLE.

At both ends of the first and second vertical power supply branch line VREF_brh and VREF_blh, source electrodes DT_S of the driving thin film transistors DT extending therefrom may be formed.

There may be drain electrodes DT_D of the driving thin film transistors DT between the second horizontal power supply branch line EVDD_brh and the second and second emission regions RLE and GLE, and between the first horizontal power supply branch line EVDD_blh and the third and fourth emission regions BLE and WLE. A first connection pattern CP1 may be disposed at the one end of the drain electrode DT_D of the driving thin film transistor DT. The first connection pattern CP1 connects the drain electrode DT_D of the driving thin film transistor DT to an anode electrode which will be described later.

The components shown in FIG. 7C may be formed of a metal such as Mo, Al, Cr, Au, Ti, Ni, Nd, and Cu, or alloy of thereof. For example, they may be formed of a double layer of molybdenum/aluminum-neodymium or molybdenum/aluminum.

Referring to FIG. 8, a passivation film PAS may be disposed to cover the entire components shown in FIG. 7C. The passivation film PAS may be formed of a silicon oxide film (SiOx), a silicon nitride film (SiNx), or a multilayer thereof to as an insulating film for protecting underlying components.

On the passivation film PAS, red, green, blue, and white color filters CF corresponding to the light emission regions RLE, GLE, BLE and WLE may be disposed. The color filters CF transmit white light emitted from an organic light emitting diode OLED to emit red, green, blue, and white lights, respectively.

An overcoat layer OC may be disposed on the passivation film PAS on which the color filters CF of red, green, blue, and white are disposed, to cover the color filters CF. The overcoat layer OC may be a planarizing film for alleviating a step-coverage of the underlying structure. The overcoat layer OC may be formed of an organic material such as polyimide, benzocyclobutene series resin, and acrylate. The overcoat layer OC may be formed by a method such as spin on glass (SOG) in which the organic material is coated in a liquid state and then cured.

Referring to FIGS. 6, 7D and 8, on the overcoat layer OC, anode electrodes AN(R), AN(G), AN(B), and AN(W) of the organic light emitting diode OLED may be disposed to correspond to the light emission regions RLE, GLE, BLE and WLE of the sub-pixels R, G, B and W. The anode electrodes AN (R), AN (G), AN (B), and AN (W) are operated as pixel electrodes. The anode electrodes AN (R), AN (G), AN (B), and AN (W) are connected to the drain electrodes DT_D of the driving thin film transistors DT exposed via contact hole passing thorough the overcoat layer OC and the passivation film PAS by the first connection pattern CP1. The drain electrode DT_D of the driving thin film transistor DT is disposed in the second circuit regions RC2, GC2, BC2, and WC2 of the sub-pixels R, G, B, and W.

The anode electrodes AN (R), AN (G), AN (B), and AN (W) may be formed of a transparent conductive material such as indium tin oxide (ITO), indium zinc oxide (IZO), or zinc oxide (ZnO). When the anode electrodes AN (R), AN (G), AN (B), AN (W) are reflective electrodes, they may further include a reflective layer. The reflective layer may be formed of Al, Cu, Ag, Ni or an alloy thereof, preferably APC (silver/palladium/copper alloy).

A bank layer BN for partitioning sub-pixels is disposed on the substrate SUB including the anode electrodes AN (R), AN (G), AN (B), and AN (W). The bank layer BN may be formed of an organic material such as polyimide, benzocyclobutene series resin, or acrylate. The bank layer BN can define the light emission regions RLE, GLE, BLE and WLE that expose the anode electrodes AN (R), AN (G), AN (B) and AN (W). A light emitting layer EML may be formed in each the light emission regions RLE, GLE, BLE and WLE so as to be in contact with the anode electrodes AN (R), AN (G), AN (B) or AN (W). The light emitting layer EML is a layer in which electrons and holes are combined to emit light. A hole injecting layer or a hole transporting layer may be disposed between the light emitting layer EML and the anode electrodes AN (R), AN (G), AN (B) or AN (W). An electron transporting layer or an electron injection layer may be disposed on the light emitting layer (EML).

A cathode electrode CAT may be positioned on the light-emitting layer EML. The cathode electrode CAT may be disposed on an entire surface of the display portion. The cathode electrode may be made of Mg, Ca, Al, Ag or an alloy thereof having a low work function. If the cathode electrode CAT is a transparent electrode, the cathode electrode CAT may have a thickness thin enough to transmit light. Also, if the cathode electrode CAT is a reflective electrode, the cathode electrode CAT may have a thickness thick enough to reflect light.

According to the electroluminescence display of the disclosure, a first circuit region and a second circuit region separated upward and downward are arranged around the light emission region of each sub-pixel, and a driving thin film transistor, a sensing thin film transistor, and a switching thin film transistor are disposed in different circuit areas. Accordingly, since the sub-pixels adjacent in the vertical direction can share a power supply line or a sensing line, the number of wiring lines can be reduced, so that the aperture ratio can be improved as much the reduced number of wiring lines Further, the storage capacitors are not disposed in the first and second circuit regions except for the light emission region in each sub-pixel. Therefore, it is possible to prevent the decrease of the aperture ratio caused due to the storage capacitor disposed in the first and second circuit areas.

It will be apparent to those skilled in the art that various modifications and variations can be made in the disclosure without departing from the spirit or scope of the disclosure. In the example disclosed in the disclosure, an electroluminescence display has been described as an example, but the disclosure is not limited thereto. The disclosure is applied to various flat panel display devices such as a liquid crystal display device (LCD), a plasma display panel (PDP), a field emission display device (FED), and an electrophoretic display device (ED). Therefore, the technical scope of the disclosure should not be limited to the contents described in the detailed description of the disclosure but should be defined by the claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electroluminescence display, comprising:
a plurality of sub-pixels arranged in rows, each of the plurality of sub-pixels including a light emission region, and a first circuit region and a second circuit region disposed on respective sides of the light emission region;
power supply lines configured to supply a first power to at least one of the second circuit regions of the sub-pixels arranged at an odd-numbered row and the first circuit regions of the sub-pixels arranged at an even-numbered row; and
a sensing line configured to supply an initialization voltage or a sensing voltage to at least one of the first circuit regions of the sub-pixels arranged at the odd-numbered row or the second circuit regions of the sub-pixels arranged in the even-numbered row,
wherein the sensing line includes horizontal sensing branch lines extended from one main vertical sensing line to both directions horizontally in the row and being connected to a plurality of sub-pixels arranged in one row, and
wherein one of the first circuit region and the second circuit region of each of the plurality of sub-pixels includes a sensing thin film transistor, and
wherein the other one of the first circuit region and the second circuit region of each of the plurality of sub-pixels includes a driving thin film transistor.

2. The electroluminescence display of claim 1, wherein the plurality of sub-pixels includes a first, a second, a third and a fourth sub-pixel, and
wherein the power supply lines include:
a first power supply line disposed at a left side of the first sub-pixel, and configured to supply a first power to the second circuit regions of the first and second sub-pixels disposed at the odd-numbered rows, and configured to supply the first power to the first circuit regions of the first and second sub-pixels disposed at the even-numbered rows; and
a second power supply line disposed at a right side of the fourth sub-pixel, and configured to supply the first power to the second circuit regions of the third and fourth sub-pixels disposed at the odd-numbered rows, and configured to supply the first power to the first circuit regions of the third and fourth sub-pixels disposed at the even-numbered row.

3. The electroluminescence display of claim 2, wherein the first power supply line includes:
a first horizontal power supply branch line connected to the first power supply line and extending along a row direction; and
a first vertical power supply branch line extending from the first horizontal power supply branch line along a column direction,
wherein the second power supply line includes:
a second horizontal power supply branch line connected to the second power supply line and extending along the row direction; and
a second vertical power supply branch line extending from the second horizontal power supply branch line along the column direction.

4. The electroluminescence display of claim 3, wherein the sensing line includes:
a first horizontal sensing branch line connected to the main vertical sensing line and extending toward the first power supply line along the row direction;
a first vertical sensing branch line extending from the first horizontal sensing branch line along the column direction;
a second horizontal sensing branch line connected to the main vertical sensing line and extending toward the second power supply line along the row direction; and
a second vertical sensing branch line extending from the second horizontal sensing branch line along the column direction.

5. The electroluminescence display of claim 4, wherein each of the first circuit regions of the sub-pixels disposed at the odd-numbered rows includes the sensing thin film transistor, wherein each of the second circuit regions of the sub-pixels disposed at the odd-numbered rows includes the driving thin film transistor, and
wherein each of the second circuit regions of the sub-pixels disposed at the even-numbered rows includes the sensing thin film transistor, wherein each of the first circuit regions of the sub-pixels disposed at the even-numbered rows includes the driving thin film transistor.

6. The electroluminescence display of claim 5, wherein the first vertical power supply branch line is connected to the driving thin film transistors of the first and second sub-pixels disposed on at least one side of upper and lower sides of the first horizontal power supply branch line, and
wherein the second vertical power supply branch line is connected to the driving thin film transistors of the third and fourth sub-pixels disposed on at least one side of upper and lower sides of the second horizontal power supply branch line.

7. The electroluminescence display of claim 5, wherein the first vertical sensing branch line is connected to the sensing thin film transistors of the first and second sub-pixels disposed on at least one side of upper and lower sides of the first horizontal sensing branch line, and
wherein the second vertical sensing branch line is connected to the sensing thin film transistors of the third and fourth sub-pixels disposed on at least one side of upper and lower sides of the second horizontal sensing branch line.

8. The electroluminescence display of claim 5, further comprising:
a first and second data lines disposed between the first sub-pixel and the second sub-pixel, and extending in parallel with each other along the column direction; and
a third and fourth data lines disposed between the third sub-pixel and the fourth sub-pixel, and extending in parallel with each other along the column direction,
wherein the first circuit region of each the first to fourth sub-pixels disposed at the odd-numbered row and the second circuit region of each the first to fourth sub-pixels disposed at the even-numbered row include a switching thin film transistor, respectively,
the first data line is connected to the switching thin film transistor of the first sub-pixel;

the second data line is connected to the switching thin film transistor of the second sub-pixel;

the third data line is connected to the switching thin film transistor of the third sub-pixel; and the fourth data line is connected to the switching thin film transistor of the fourth sub-pixel.

9. The electroluminescence display of claim 8, further comprising a first scan line and a second scan line disposed at one side of the sub-pixels disposed at one row and extending in parallel with each other along the row direction, wherein the first scan line is connected to a gate electrode of the sensing thin film transistor, and the second scan line is connected to a gate electrode of the switching thin film transistor.

10. The electroluminescence display of claim 8, wherein the light emission region includes a transparent storage capacitor having a first electrode connected to a drain electrode of the sensing thin film transistor and a second electrode connected to a drain electrode of the switching thin film transistor.

11. The electroluminescence display of claim 1, further comprising a storage capacitor having a first electrode and a second electrode facing each other with an insulating layer interposed therebetween in the light emission region.

12. The electroluminescence display of claim 1, wherein the sensing line is configured to supply only an initialization voltage and not a sensing voltage.

13. The electroluminescence display of claim 1, wherein the sensing line is configured to supply only a sensing voltage and not an initialization voltage.

14. An electroluminescence display, comprising:

a plurality of sub-pixels arranged in rows, each of the plurality of sub-pixels including a light emission region, and a first circuit region and a second circuit region disposed on respective sides of the light emission region;

power supply lines configured to supply a first power to at least one of the second circuit regions of the sub-pixels arranged at an odd-numbered row and the first circuit regions of the sub-pixels arranged at an even-numbered row; and a sensing line configured to supply an initialization voltage or a sensing voltage to at least one of the first circuit regions of the sub-pixels arranged at the odd-numbered row or the second circuit regions of the sub-pixels arranged in the even-numbered row, wherein the plurality of sub-pixels includes a first, a second, a third and a fourth sub-pixel, wherein the power supply lines include:

a first power supply line disposed at a left side of the first sub-pixel, and configured to supply a first power to the second circuit regions of the first and second sub-pixels disposed at the odd-numbered rows, and configured to supply the first power to the first circuit regions of the first and second sub-pixels disposed at the even-numbered rows; and a second power supply line disposed at a right side of the fourth sub-pixel, and configured to supply the first power to the second circuit regions of the third and fourth sub-pixels disposed at the odd-numbered rows, and configured to supply the first power to the first circuit regions of the third and fourth sub-pixels disposed at the even-numbered row, wherein the first power supply line includes:

a first horizontal power supply branch line connected to the first power supply line and extending along a row direction; and a first vertical power supply branch line extending from the first horizontal power supply branch line along a column direction, wherein the second power supply line includes:

a second horizontal power supply branch line connected to the second power supply line and extending along the row direction; and a second vertical power supply branch line extending from the second horizontal power supply branch line along the column direction, wherein the sensing line includes:

a first horizontal sensing branch line connected to the sensing line and extending toward the first power supply line along the row direction;

a first vertical sensing branch line extending from the first horizontal sensing branch line along the column direction;

a second horizontal sensing branch line connected to the sensing line and extending toward the second power supply line along the row direction; and a second vertical sensing branch line extending from the second horizontal sensing branch line along the column direction, wherein each of the first circuit regions of the sub-pixels disposed at the odd-numbered rows includes a sensing thin film transistor, wherein each of the second circuit regions of the sub-pixels disposed at the odd-numbered rows includes a driving thin film transistor, and wherein each of the second circuit regions of the sub-pixels disposed at the even-numbered rows includes a sensing thin film transistor, wherein each of the first circuit regions of the sub-pixels disposed at the even-numbered rows includes a driving thin film transistor.

15. An electroluminescence display, comprising:

a plurality of sub-pixels arranged in rows, each of the plurality of sub-pixels including a light emission region, and a first circuit region and a second circuit region disposed on respective sides of the light emission region;

power supply lines configured to supply a first power to at least one of the second circuit regions of the sub-pixels arranged at an odd-numbered row and the first circuit regions of the sub-pixels arranged at an even-numbered row; and a sensing line configured to supply an initialization voltage or a sensing voltage to at least one of the first circuit regions of the sub-pixels arranged at the odd-numbered row or the second circuit regions of the sub-pixels arranged in the even-numbered row, wherein each of the first circuit regions of the sub-pixels disposed at the odd-numbered rows includes a sensing thin film transistor, wherein each of the second circuit regions of the sub-pixels disposed at the odd-numbered rows includes a driving thin film transistor, and wherein each of the second circuit regions of the sub-pixels disposed at the even-numbered rows includes a sensing thin film transistor, wherein each of the first circuit regions of the sub-pixels disposed at the even-numbered rows includes a driving thin film transistor.

16. The electroluminescence display of claim 15, wherein the plurality of sub-pixels includes a first, a second, a third and a fourth sub-pixel, and wherein the power supply lines include:
- a first power supply line disposed at a left side of the first sub-pixel, and configured to supply a first power to the second circuit regions of the first and second sub-pixels disposed at the odd-numbered rows, and configured to supply the first power to the first circuit regions of the first and second sub-pixels disposed at the even-numbered rows; and
- a second power supply line disposed at a right side of the fourth sub-pixel, and configured to supply the first power to the second circuit regions of the third and fourth sub-pixels disposed at the odd-numbered rows, and configured to supply the first power to the first circuit regions of the third and fourth sub-pixels disposed at the even-numbered row.

17. The electroluminescence display of claim 16, wherein the first power supply line includes:
- a first horizontal power supply branch line connected to the first power supply line and extending along a row direction; and
- a first vertical power supply branch line extending from the first horizontal power supply branch line along a column direction, wherein the second power supply line includes:
- a second horizontal power supply branch line connected to the second power supply line and extending along the row direction; and
- a second vertical power supply branch line extending from the second horizontal power supply branch line along the column direction.

18. The electroluminescence display of claim 17, wherein the sensing line includes:
- a first horizontal sensing branch line connected to the sensing line and extending toward the first power supply line along the row direction;
- a first vertical sensing branch line extending from the first horizontal sensing branch line along the column direction;
- a second horizontal sensing branch line connected to the sensing line and extending toward the second power supply line along the row direction; and
- a second vertical sensing branch line extending from the second horizontal sensing branch line along the column direction.

* * * * *